(12) United States Patent
Misgen et al.

(10) Patent No.: US 10,135,200 B2
(45) Date of Patent: Nov. 20, 2018

(54) EMBEDDED PLATFORM IN ELECTRICAL CABLES

(71) Applicant: International Business Machines Corporation, Armonk, NY (US)

(72) Inventors: Marvin M. Misgen, Rochester, MN (US); Michael P. Petrich, Rochester, MN (US); Joseph F. Prisco, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 274 days.

(21) Appl. No.: 15/232,416

(22) Filed: Aug. 9, 2016

(65) Prior Publication Data

US 2018/0048097 A1  Feb. 15, 2018

(51) Int. Cl.
*G01R 19/00* (2006.01)
*H01R 13/66* (2006.01)
*H01R 11/05* (2006.01)
*G01R 31/02* (2006.01)
*G08C 19/02* (2006.01)
*G01R 31/44* (2006.01)
(Continued)

(52) U.S. Cl.
CPC ........... *H01R 13/6683* (2013.01); *G01R 5/00* (2013.01); *G01R 31/021* (2013.01); *G01R 31/44* (2013.01); *G08C 19/02* (2013.01); *H01R 11/05* (2013.01); *H01R 31/065* (2013.01); *G01R 15/20* (2013.01); *H01B 7/36* (2013.01); *H01R 24/22* (2013.01); *H01R 24/30* (2013.01); *H01R 24/60* (2013.01); *H04L 67/12* (2013.01)

(58) Field of Classification Search
CPC .. H01R 13/6683; H01R 11/05; G01R 31/021;
G01R 19/0084; G01R 19/0092; G01R 23/00; G01R 23/02; G01R 23/09; G01R 15/12; G01R 15/146; G01R 15/148; G08C 19/02; H04L 67/12
USPC ............ 324/66, 76.39, 76.11, 538, 539, 543, 324/103 R, 103 P, 110, 127, 96, 522, 713; 336/173, 225; 361/659, 661, 664, 666, 361/668
See application file for complete search history.

(56) References Cited

U.S. PATENT DOCUMENTS 6,123,556 A    9/2000  Asakura et al.
7,374,101 B2   5/2008  Kaneko
(Continued)

OTHER PUBLICATIONS

Maxim, Smart Cable Aids Quality Control and Authentication, Oct. 15, 2009. Maxim Integrated Products, Inc.*
(Continued)

*Primary Examiner* — Jermele M Hollington
*Assistant Examiner* — Sean Curtis
(74) *Attorney, Agent, or Firm* — Patterson + Sheridan, LLP (57) ABSTRACT

A platform embedded in an electrical cable that stores and transmits data or information related to the electrical cable is designed. The embedded platform includes a non-volatile memory element to store product data describing at least one of electrical characteristics and certifications of the electrical cable. The platform also includes a current detector to detect a current that flows in the electrical cable based on a magnetic field generated by the current. The platform further includes a communication circuit to transmit at least one of the stored product data and information related to the detection of the current to a remote device.

20 Claims, 9 Drawing Sheets

(51) Int. Cl.
    *H01R 31/06* (2006.01)
    *G01R 5/00* (2006.01)
    *H04L 29/08* (2006.01)
    *H01R 24/22* (2011.01)
    *H01R 24/30* (2011.01)
    *H01R 24/60* (2011.01)
    *H01B 7/36* (2006.01)
    *G01R 15/20* (2006.01)

(56) References Cited

U.S. PATENT DOCUMENTS

| | | | | |
|---|---|---|---|---|
| 7,646,299 | B2 | 1/2010 | Krill | |
| 7,683,795 | B2* | 3/2010 | Bjorn | G01R 15/246 324/96 |
| 7,696,857 | B2 | 4/2010 | Kritt et al. | |
| 7,774,268 | B2 | 8/2010 | Bradley et al. | |
| 8,624,579 | B2* | 1/2014 | Chamorovskiy | G01R 15/246 250/227.17 |
| 8,949,054 | B2* | 2/2015 | Bjorn | G01R 15/246 324/547 |
| 2006/0170410 | A1* | 8/2006 | Bjorn | G01R 15/246 324/96 |
| 2010/0295692 | A1* | 11/2010 | Bjorn | G01R 15/246 340/650 |
| 2011/0115469 | A1* | 5/2011 | Kondo | G01R 15/245 324/96 |
| 2012/0286767 | A1* | 11/2012 | Chamorovskiy | G01R 15/246 324/96 |
| 2015/0071274 | A1 | 3/2015 | Sugar et al. | |
| 2016/0282497 | A1* | 9/2016 | Turnbeaugh | G01V 3/10 |
| 2018/0048097 | A1* | 2/2018 | Misgen | H01R 13/6683 |

OTHER PUBLICATIONS

ZigBee. Zigbee Smart Cable Meter ZBS-112/16, Copyright 2013—Didactum Security GmbH.*
Paracable, Apple Lighting Cables, Copyright 2018—Paracable, Inc.*
Apple Support, Identify counterfeit or uncertified lightning connector accessories, Copyright 2018, Apple, Inc.*
Paracable, What is Apple MFI certification?, Copyright 2018—Paracable, Inc.*
Limer, Eric: "Here's the Chip Apple is Using to Stop You From Buying Cheap Cables", Gizmodo.com, http://gizmodo.com/5945889/some-third-party-adapters-might-not-work-with-your-new-iphone?utm_expid=66866090-67.e9PWeE2DSnKObF, Sep. 12, 2012.
Case Study: "NY Contractor's Encounter with Counterfeit Cable", Washington, DC, Mar. 19, 2015, <http://www.cccassoc.org/topics/anti-counterfeit/anti-counterfeit-press-releases/case-study-ny-contractors-encounter-counterfeit-cable/?utm_source=Q1+2015+News+-+New+Members+l+NYC+Counterfeit+Case+l+CableCheck+Game+Winner&utm_campaign=NYC+Counterfeit+Case&utm_medium=email>.
CCCA: "Good Cable, Bad Cable", Oct. 16, 2015, http://www.cablinginstall.ccm/articles/2015/10/ccca-goodbad-cable.html.
UL Newsroom: "UL warns of potentially hazardous communications cables (Releases 15PN-01, 15PN-03 and 15PN-04)", Public Notice, Mar. 16, 2015, <http://ul.com/newsroom/publicnotices/ul-warns-of-potentially-hazardous-communications-cables-releases-15pn-01-15pn-03-and-15pn-04/>.

* cited by examiner

EMBEDDED PLATFORM IN ELECTRICAL CABLES

BACKGROUND

The present invention relates to the design of a platform embedded in an electrical cable, and more specifically, to the design of a platform embedded in an electrical cable that stores and transmits data or information related to the electrical cable.

Installing counterfeit or cables that are not certified by a nationally recognized test laboratory (NRTL) in data centers can negatively impact the performance of the data center. The use of counterfeit or uncertified cables can increase the risk of fire, reduce the signal to noise ratio (SNR), and increase the risk of product failure.

SUMMARY

According to one embodiment of the present invention, an electrical cable comprises an embedded platform. The embedded platform comprises a non-volatile memory element configured to store product data describing at least one of electrical characteristics and certifications of the electrical cable. The embedded platform also comprises a current detector configured to detect a current that flows in the electrical cable based on a magnetic field generated by the current. The embedded platform further comprises a communication circuit configured to transmit at least one of the stored product data and information related to the detection of the current to a remote device.

According to another embodiment of the present invention, a platform is embedded in an electrical cable. The platform comprises a non-volatile memory element configured to store product data describing at least one of electrical characteristics and certifications of the electrical cable. The platform also comprises a current detector configured to detect a current that flows in the electrical cable based on a magnetic field generated by the current. The platform further comprises a communication circuit configured to transmit at least one of the stored product data and information related to the detection of the current to a remote device.

According to another embodiment of the present invention, a method comprises storing product data describing at least one of electrical characteristics and certifications of an electrical cable. The method also comprises detecting a current that flows in the electrical cable based on a magnetic field generated by the current. The method further comprises transmitting at least one of the stored product data and information related to the detection of the current from the electrical cable to a remote device.

DETAILED DESCRIPTION

Identifying counterfeit or uncertified cables is important to ensure the compliance with the National Electrical Code (NEC) or other applicable product safety requirements. One way to identify counterfeit or uncertified cables is by visual inspection and manual review. For examples, the installers may manually review all the cables against the specifications in the customer contract. The installers may also check the packaging that includes the cables for appropriate NRTL marks as well as neat and orderly packaging of the cables to ensure the cables are not counterfeit. The installers may also review the manufacturer's website or product safety agency's website for product safety information and warnings. However, visual inspection and manual review are time consuming and also subject to human errors.

Another way is to install a chip on each cable port or each communication card that does not allow operation if a counterfeit or uncertified cable is connected to the cable port or the communication card. In this method, counterfeit or uncertified cables can only be detected when the communication cards and ports used in servers, storage or networking equipment are powered on. Also, in this method, in order for the chip installed on the cable ports or communication cards to identify counterfeit or uncertified cables, the counterfeit or uncertified cables must be already installed and connected to the cable ports or the communication cards, but the installed counterfeit or uncertified cables may cause fire or other safety issues once energized.

Therefore, it would be advantageous to identify counterfeit or uncertified cables in a more efficient and safer way even before the cables are connected to a computing system and/or energized.

In one embodiment of the present invention, an embedded platform is disposed in an electrical cable. The embedded platform stores and transmits data related to the electrical cable to a remote device. The remote device can identify whether the electrical cable is counterfeit or uncertified based on the received data.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present invention may take the form of an entirely hardware embodiment, an entirely software embodiment (including firmware, resident software, microcode, etc.) or an embodiment combining software and hardware aspects that may all generally be referred to herein as a "circuit," "module" or "system."

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 1A:
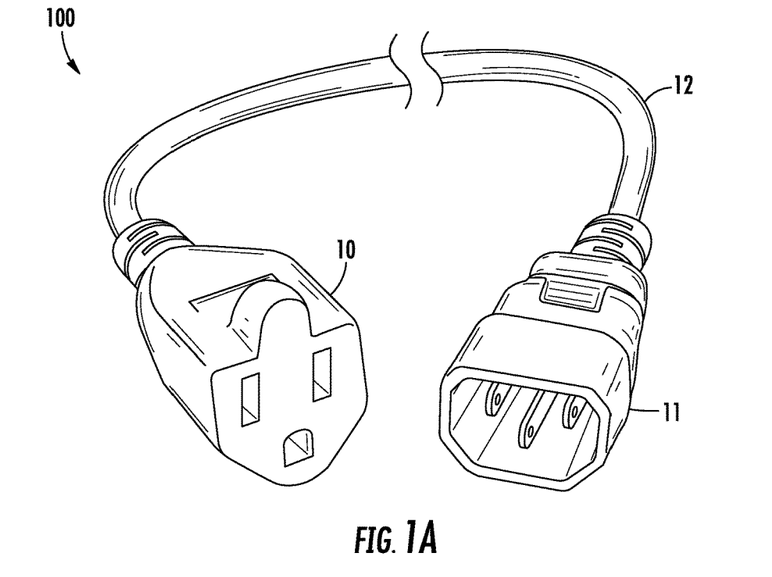
FIG. 1A shows an electrical cable according to one embodiment described herein.

FIG. 1A shows an electrical cable according to one embodiment of the present invention. The electrical cable 100 has two end connectors 10 and 11 and a flexible body 12 disposed between the two end connectors 10 and 11. In one embodiment, the end connectors 10 and 11 include a male and female connector. Although not shown in FIG. 1A, an embedded platform is embedded into the electrical cable 100 which is described in more detail below. The electrical cable 100 in FIG. 1A may be a power cable.

Figure 1B:
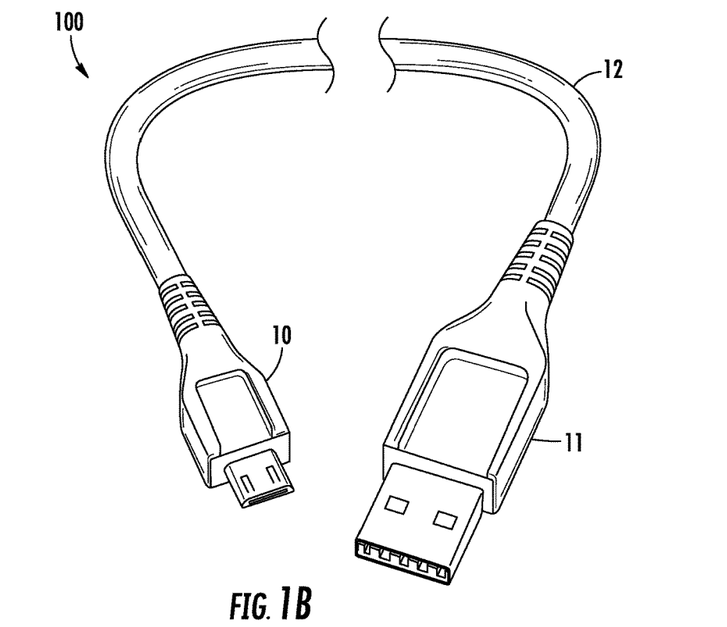
FIG. 1B shows an electrical cable according to another embodiment described herein.

FIG. 1B shows an electrical cable according to another embodiment of the present invention. As in FIG. 1A, the electrical cable 100 has two end connectors 10 and 11 (e.g., a male and female connector) and a flexible body 12 disposed between the two end connectors 10 and 11. An embedded platform is embedded into the electrical cable 100 (not shown in FIG. 1B). The electrical cable 100 in FIG. 1B may be a data cable for transmitting AC or DC signals.

Figure 1C:
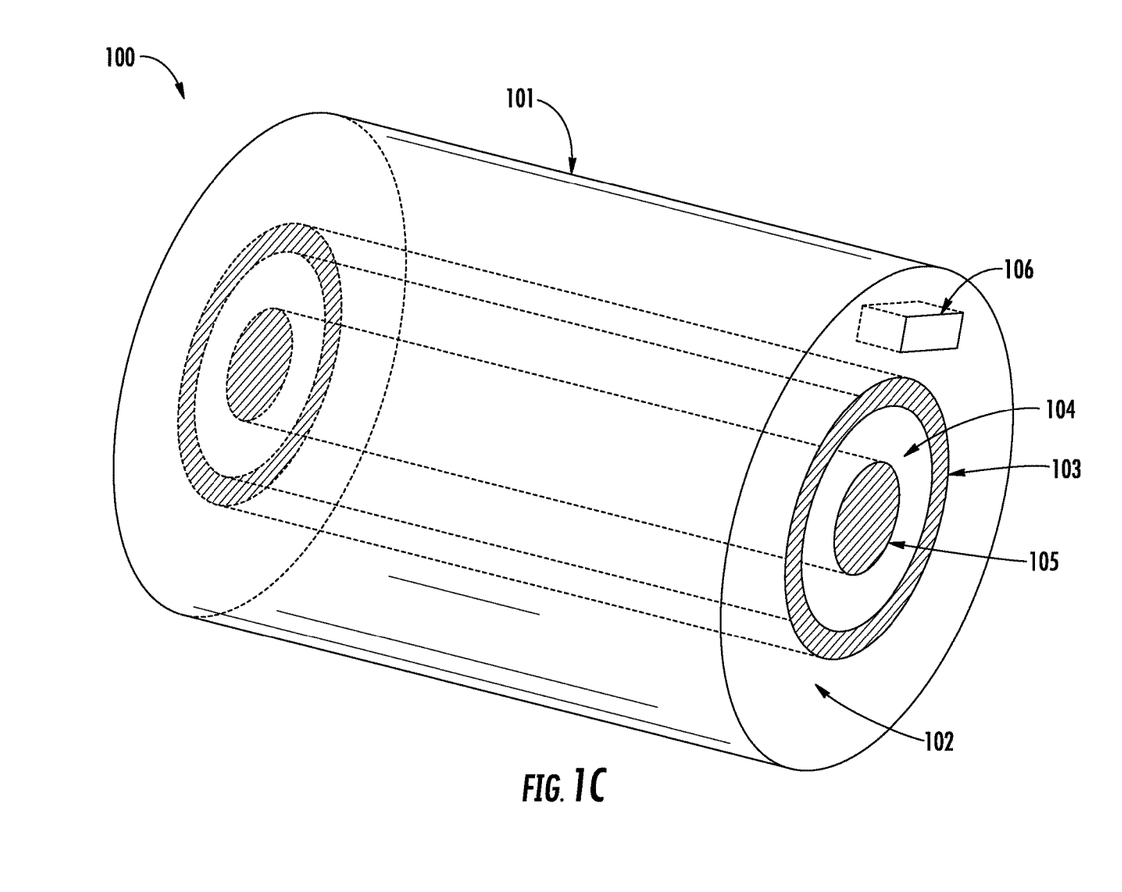
FIG. 1C shows an electrical cable including an embedded platform according to one embodiment described herein.

FIG. 1C shows an electrical cable according to one embodiment of the present invention. As shown, an electrical cable 100 includes a surface 101, a jacket layer 102 below the surface 101, a first conductor 103 below the jacket layer 102, an insulation layer 104 below the shield layer 103, and a second conductor 105 in the center of the electrical cable 100. The jacket layer 102 may provide physical toughness or heat resistance to the electrical cable 100. The insulation layer 104 may include dielectric such as polyolefin to provide insulation between the first and second conductors 103, 105. In one embodiment, the first conductor 103 may include a wire mesh made from a conductive material. The second conductor 105 may include copper wires to transmit electrical signals. Moreover, the first conductor 103 may form a shield layer or a ground layer used when transmitting data signals on the second conductor 105.

In FIG. 1C, an embedded platform is embedded into the electrical cable 100. For example, FIG. 1C shows that an embedded platform 106 is embedded in the jacket layer 102 of the electrical cable 100. The embedded platform 106 can be used to identify whether the electrical cable 100 is a counterfeit or uncertified cable.

Figure 1D:
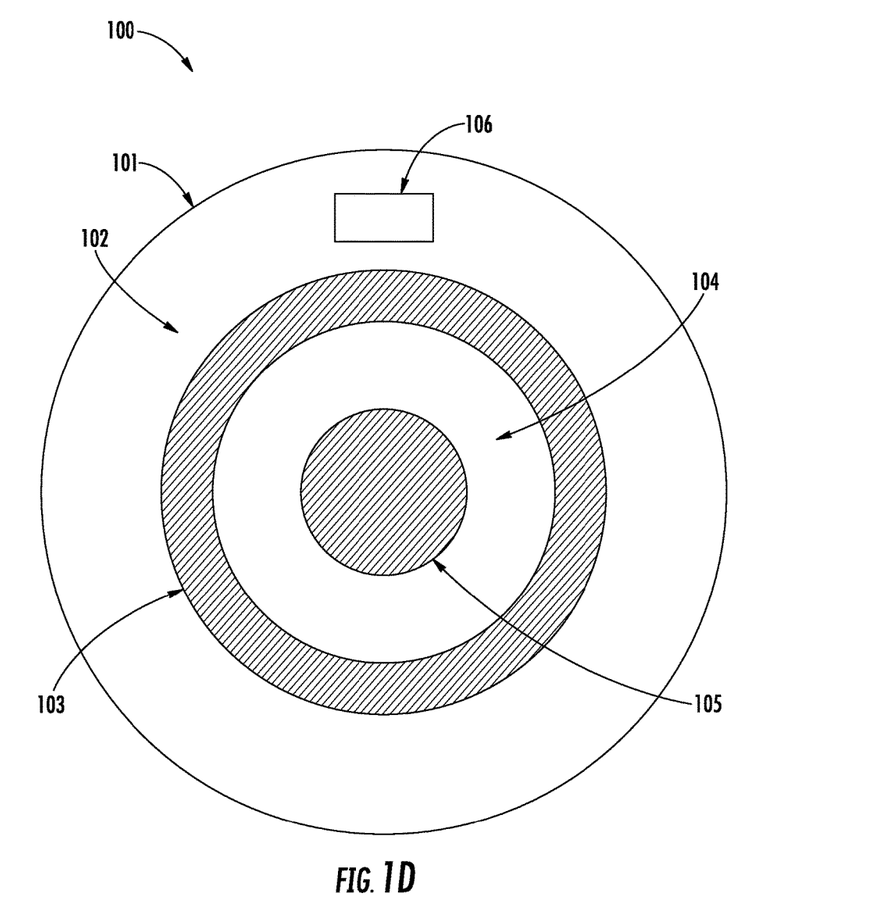
FIG. 1D shows a cross-sectional view of an electrical cable including an embedded platform according to the embodiment described in FIG. 1C.

FIG. 1D shows a cross-sectional view of the electrical cable 100 including the embedded platform 106 according to the embodiment described in FIG. 1C. Similarly as in FIG. 1C, in FIG. 1D, the electrical cable 100 includes the surface 101, the jacket layer 102, the shield layer 103, the insulation layer 104 and the conductor part 105. The embedded platform 106 is embedded in the jacket layer 102 of the electrical cable 100.

Figure 1E:
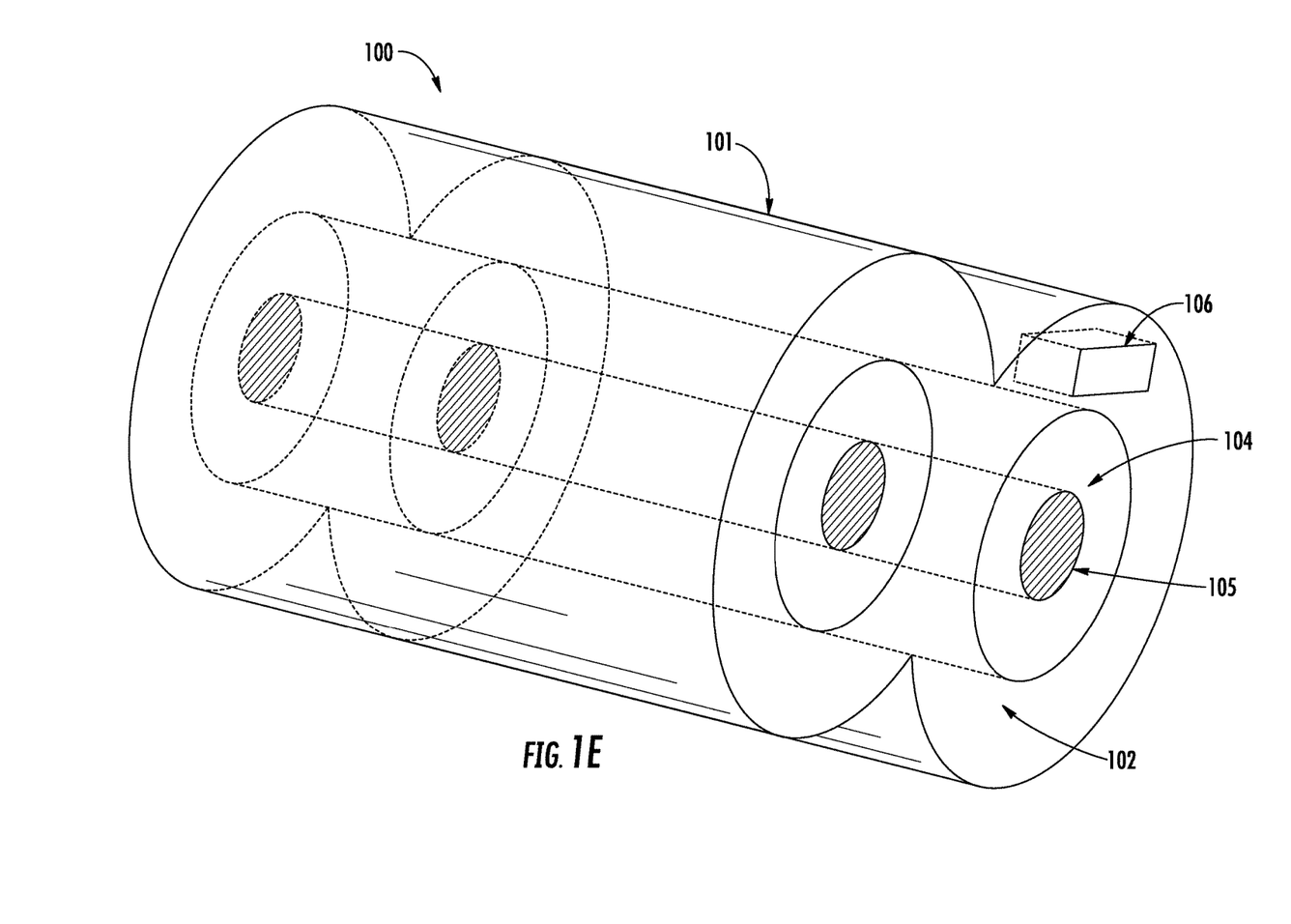
FIG. 1E shows an electrical cable including an embedded platform according to another embodiment described herein.

FIG. 1E shows an electrical cable according to another embodiment of the present invention. As shown in FIG. 1E, an electrical cable 100 includes a surface 101, a jacket layer 102, an insulation layer 104, and two conductor parts 105. Similarly as in FIG. 1C, an embedded platform 106 is embedded in the jacket layer 102 of the electrical cable 100.

Figure 1F:
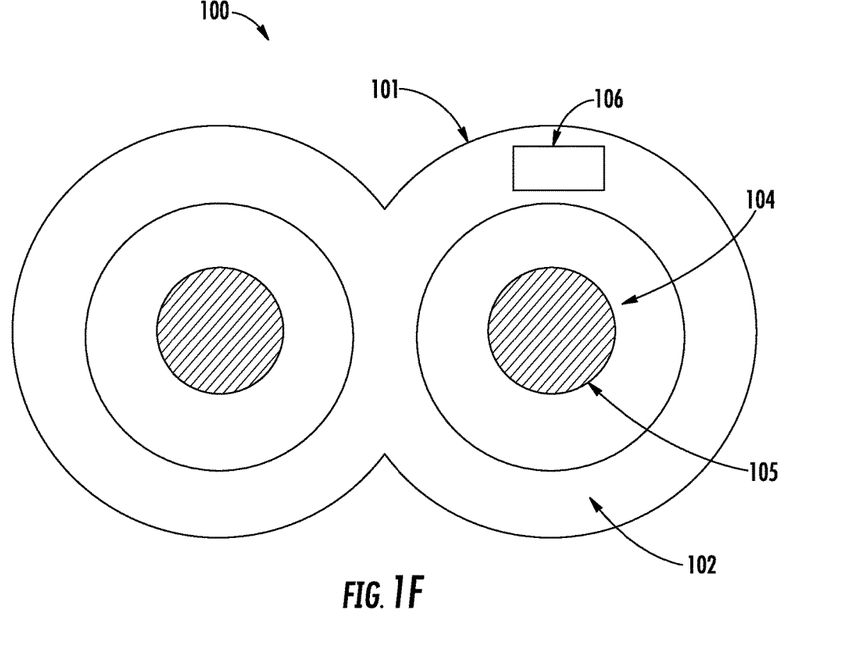
FIG. 1F shows a cross-sectional view of an electrical cable including an embedded platform according to the embodiment described in FIG. 1E.

FIG. 1F shows a cross-sectional view of the electrical cable 100 including the embedded platform 106 according to the embodiment described in FIG. 1E. Similarly as in FIG. 1E, in FIG. 1F, the electrical cable 100 includes the surface 101, the jacket layer 102, the insulation layer 104 and the two conductor parts 105. The embedded platform 106 is embedded in the jacket layer 102 of the electrical cable 100.

FIGS. 1C-1F show only two exemplary embodiments of the present invention. In other embodiments, the electrical cable 100 may include different or additional layers or components, as understood by an ordinary person in the art. The electrical cable 100 can be made of two or more wires running side by side and bonded, twisted, or braided together to form a single assembly. The two ends of the assembly can be connected to two devices, enabling the transfer of electrical signals from one device to the other, as understood by an ordinary person in the art. In other embodiments, a plurality of embedded platforms may be embedded in the electrical cable 100. In other embodiments, the embedded platform 106 can be embedded to locations other than the jacket layer 102. For example, the embedded platform 106 can be embedded to the insulation layer 104. In other embodiments, the embedded platform 106 can be embedded in the connectors of the electrical cable 100. The embedded platform 106 can be embedded in the electrical cable 100 during manufacture or assembly of the electrical cable 100.

Figure 2:
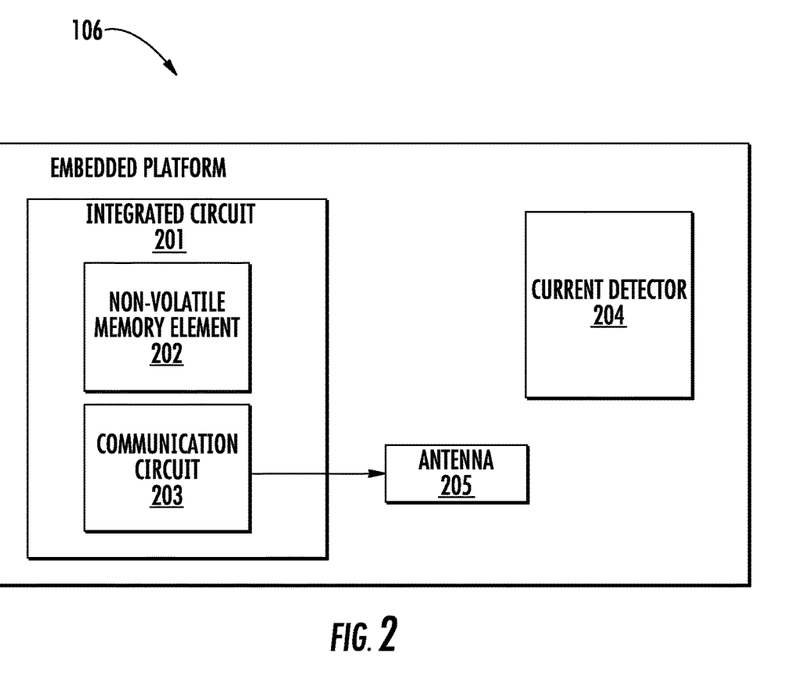
FIG. 2 is a block diagram that shows an embedded platform according to one embodiment described herein.

FIG. 2 is a block diagram that shows an embedded platform 106 according to one embodiment described herein. In FIG. 2, the embedded platform 106 is a printed circuit board (PCB). The embedded platform 106 includes an integrated circuit 201 disposed on the PCB. The integrated circuit 201 includes a non-volatile memory element 202 and a communication circuit 203. The communication circuit 203 is connected to an antenna 205 to transmit and receive signals. The embedded platform 106 also includes a current detector 204 disposed on the PCB.

In another embodiment, the embedded platform 106 can be a semiconductor chip, e.g., a hybrid wafer chip. In this example, the non-volatile memory element 202, the communication circuit 203 and the current detector 204 can be all integrated into or disposed on the same semiconductor chip. In other embodiments, the embedded platform 106 may include part of the non-volatile memory element 202, the communication circuit 203 and the current detector 204 on the semiconductor chip. For example, the embedded platform 106 may only include the current detector 204 on the semiconductor chip while the non-volatile memory element 202 and the communication circuit 203 are disposed on a PCB.

The communication circuit 203 can transmit data or information to a remote device or to other embedded platforms embedded in the electrical cable 100. In one embodiment, the communication circuit 203 can use Radio-frequency identification (RFID) technologies to transmit or broadcast data or information. Both active and passive RFID technologies can be used. For example, when using passive RFID, the embedded platforms do not need a power supply and can use power in a received signal to perform the functions described herein. Alternatively, the embedded platform may include a battery for powering the components in the embedded platform. In other embodiments, the communication circuit 203 can use other existing communication technologies, e.g., Bluetooth, as understood by an ordinary person in the art. In one embodiment, the communication circuit 203 can only broadcast data or information. In some embodiments, the remote device can be a remote data center or a remote data hub.

The non-volatile memory element 202 can be an non-volatile memory, e.g., read-only memory, as understood by an ordinary person in the art. The non-volatile memory element 202 stores product data associated with the electrical cable 100. In one embodiment, the stored product data may be vital product data (VPD) associated with the electrical cable 100. The product data stored in the non-volatile memory element 202 can be transmitted or broadcasted to a remote device through the communication circuit 203. In this way, authorities having jurisdiction (AHJs) such as electrical inspectors, building inspectors and fire marshals can access and utilize the product data through the remote device. For example, these AHJs can assess the installation, application, configuration, and utilization of the electrical cable 100 against applicable codes, ordinances, or standards. Based on the assessments, AHJs can identify whether the electrical cable 100 is a counterfeit or uncertified electrical cable. Some examples of product data stored in the non-volatile memory element 202 are described below.

The product data stored in the non-volatile memory element 202 may include a certificate of authenticity that only an authorized manufacturer of electrical cables can create or provide. Thus, AHJs can use the certificate of authenticity to identify whether the electrical cable 100 is manufactured by an authorized manufacturer. If the electrical cable 100 is not manufactured by an authorized manufacturer, the electrical cable 100 can be identified as a counterfeit or uncertified electrical cable.

The product data stored in the non-volatile memory element 202 may also include cable jacket information such as electrical ratings (e.g., voltage, amperage), flammability ratings, and temperature ratings. Thus, AHJs can use this jacket information for assessment against an approved electrical code installation. For example, the National Electrical Code (NEC) defines requirements for cables installed under raised-floors, risers, and plenums. If the electrical cable 100 does not satisfy the NEC requirements, the electrical cable 100 can be identified as a counterfeit or uncertified electrical cable.

The product data stored in the non-volatile memory element 202 may also include cable construction parameters such as conductor size, number of conductors, type of connectors on each end and length of the cable. Thus, AHJs can use the construction parameters to detect unauthorized modifications or alterations to the electrical cable 100. If unauthorized modifications or alterations are detected, the electrical cable 100 can be identified as a counterfeit or uncertified electrical cable.

The product data stored in the non-volatile memory element 202 may also include NRTL approval and reports that can be loaded for proof of certification. A list of product safety approvals can be stored with hyperlinks, e.g., HTTP links, to the manufacturer's website or the product safety agency's websites where the reports are accessible. Thus, AHJs can review the NRTL approval and reports or visit manufacturer's website or the product safety agency's websites through the links included in the product data to verify required safety information.

The product data stored in the non-volatile memory element 202 may also include initial measurements of torque and impedance of the electrical cable 100. The initial measurements of torque and impedance of the electrical cable 100 can be used during maintenance of the electrical cable 100. Over time, electrical connections change due to heating or corrosion. AHJs can use the measurement data to identify whether the electrical cable 100 is strained or worn by comparing the current torque and impedance with the initial measurements of the electrical cable 100 stored in the non-volatile memory element 202.

In one embodiment, the non-volatile memory element 202 can be programmed by the manufacturer during the cable assembly process. In other words, the product data is stored in the non-volatile memory element 202 during assembly of the electrical cable 100 before the electrical cable 100 is shipped to the customers. In this way, the non-volatile memory element 202 would be embedded in a manner such that it cannot be compromised by its electrical environment, e.g., affected by the magnetic field generated by the current flowing in the electrical cable 100. In other embodiments, Electromagnetic Compatibility (EMC) shielding may be used to ensure that the functions of the non-volatile memory element 202 are not compromised by its electrical environment.

In one embodiment, the current detector 204 is a current detector that can determine whether a current (AC current or DC current) is flowing in the electrical cable 100 based on a magnetic field in the current detector 204. The current detector 204 can also measure the detected current that flows in the electrical cable 100. The magnetic field is generated by the current that flows in the electrical cable 100. In one embodiment, the current detector 204 can measure the amperage value of the current that flows in the electrical cable 100. Information related to detection of the current and the measured data related to the detected current can be transmitted or broadcasted to a remote device through the communication circuit 203. In this way, AHJs can utilize the information and data provided by the current detector 204 to identify whether the electrical cable 100 is a counterfeit or uncertified electrical cable.

Figure 3A:
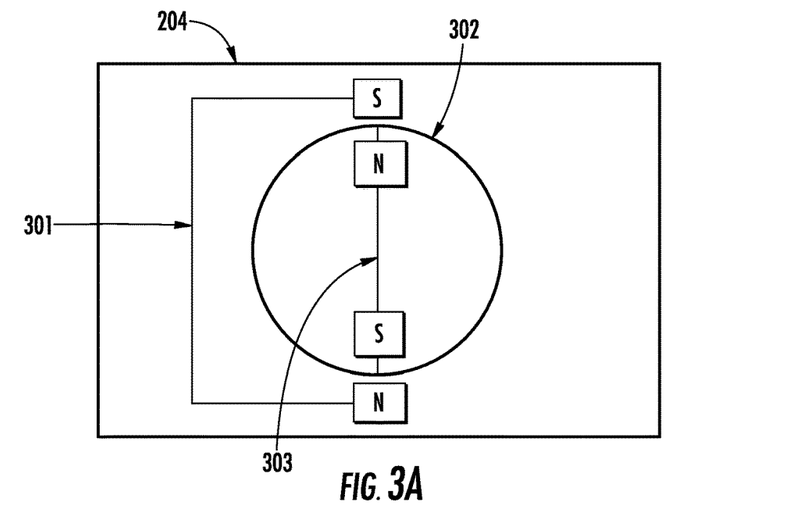
FIG. 3A shows a current detector within an embedded platform according to one embodiment described herein.

FIG. 3A shows a current detector 204 within an embedded platform 106 according to one embodiment described herein. As shown in FIG. 3A, the current detector 204 includes a fixed magnet 301. The magnet 301 is fixed in the sense that the south pole and north pole of the magnet 301 have two fixed positions, respectively. For example, as shown in FIG. 3A, the south pole of the magnet 301 is fixed in the top part of the current detector 204 and the north pole of the magnet 301 is fixed in the bottom part of the current detector 204. The current detector 204 also includes a rotatable wheel 302. The rotatable wheel 302 is coupled to another magnet 303.

The current detector 204 as shown in FIG. 3A can be used to detect whether AC current is flowing in the electrical cable. When no AC current is detected, the wheel 302 is stationary at its resting position, i.e., the wheel 302 is not rotating. The resting position is determined by the fixed magnet 301 and the magnet 303 coupled to the wheel 302. As shown in FIG. 3A, the magnet 303 is positioned such that the north pole of the magnet 303 is attracting the south pole of the fixed magnet 301, and the south pole of the magnet 303 is attracting the north pole of the fixed magnet 301. In this way, when no AC current is detected, the wheel 302 is kept stationary due to the attractiveness between the fixed magnet 301 and the magnet 303.

Figure 3B:
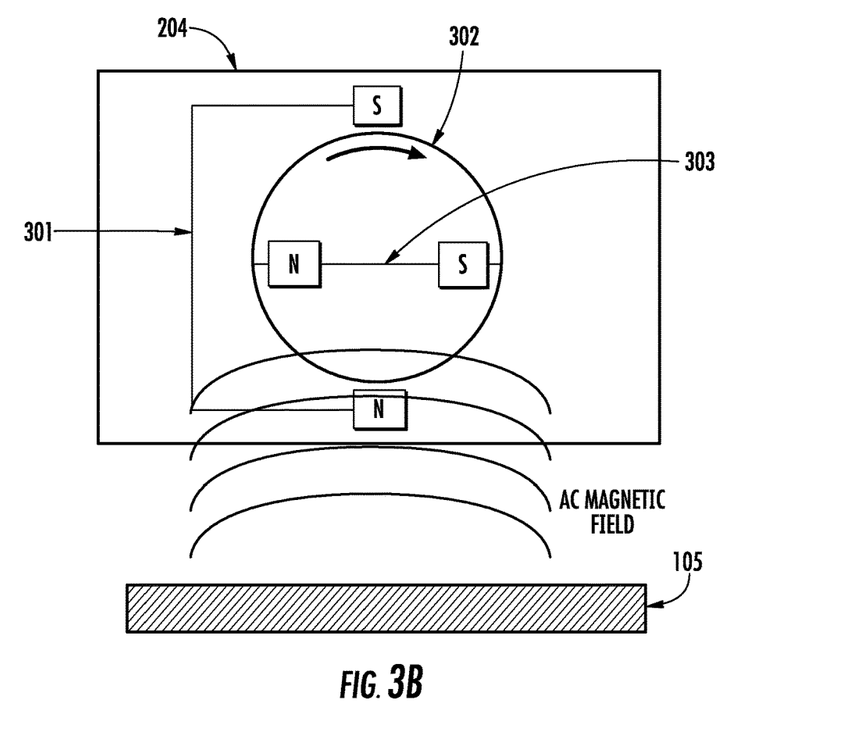
FIG. 3B shows a current detector within an embedded platform to detect alternating current (AC) according to one embodiment described herein.

FIG. 3B shows how the current detector 204 can detect AC according to one embodiment. Specifically, FIG. 3B shows that when AC current flows in the electrical cable 100, the rotatable wheel 302 starts to rotate. As shown in FIG. 3B, when AC current flows through the conductor part 105 of the electrical cable 100, the AC current generates an AC magnetic field. The generated AC magnetic field varies and alternates the magnetic field, which causes the rotatable wheel 302 to rotate. Although not shown, the current detector 204 can include a sensor that determines when the wheel 302 moves from the state shown in FIG. 3A. Thus, if the rotatable wheel 302 starts to rotate, the current detector 204 can inform the communication circuit 203 that AC current is flowing in the electrical cable 100.

In another embodiment, the current detector 204 can measure the amperage value of the AC current that flows in the electrical cable 100. For example, the current detector 204 may calculate the speed of the rotation of the rotatable wheel 302. In one embodiment, the current detector 204 may calculate the speed of the rotation of the rotatable wheel 302 based on the number of rotations in a certain time period. For example, the current detector 204 may calculate the speed of the rotation of the rotatable wheel 302 based on how many times the rotatable wheel 302 passes its resting position in a certain time period. There can be a correlation between the speed of the rotation of the rotatable wheel 302 and a pre-determined amperage value. In this way, when the speed of the rotation of the rotatable wheel 302 is calculated, the current detector 204 can determine the amperage value of the AC current that flows in the electrical cable 100 by checking the corresponding pre-determined amperage value.

FIG. 3A and FIG. 3B are only exemplary embodiments. In other embodiments, different number of magnets may be used. In other embodiments, the two fixed positions of the magnet 301 may be different. For example, the north pole of the magnet 301 may be fixed in the top part of the current detector 204 and the south pole of the magnet 301 may be fixed in the bottom part of the current detector 204. Accordingly, the magnet 303 may be coupled to the rotatable wheel 302 in a different way to attract the fixed magnet 301, as understood by an ordinary person in the art.

Figure 4A:
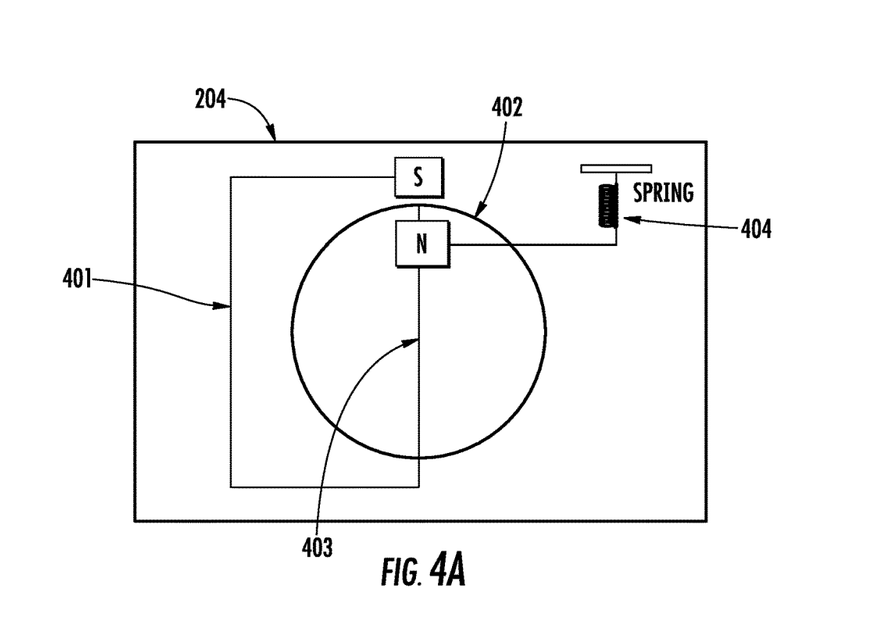
FIG. 4A shows a current detector within an embedded platform according to another embodiment described herein.

FIG. 4A shows a current detector 204 within an embedded platform 106 according to another embodiment described herein. As shown in FIG. 4A, the current detector 204 includes a fixed magnet 401. The magnet 401 is fixed in the sense that the south pole of the magnet 401 has a fixed position. For example, as shown in FIG. 4A, the south pole of the magnet 401 is fixed in the top part of the current detector 204. The current detector 204 also includes a rotatable wheel 402. The rotatable wheel 402 is coupled to another magnet 403 and also coupled to a recoil mechanism 404. In one embodiment, the recoil mechanism 404 is a spring.

The current detector 204 as shown in FIG. 4A can be used to detect whether DC current is flowing in the electrical cable. When no DC current is detected, the wheel 402 is stationary at its first resting position, i.e., the wheel 402 is not rotating. The first resting position is determined by the fixed magnet 401 and the magnet 403 coupled to the wheel 402. As shown in FIG. 4A, the magnet 403 is positioned such that the north pole of the magnet 403 is attracting the south pole of the fixed magnet 401. In this way, when no DC current is detected, the wheel 402 is kept stationary due to the attractiveness between the fixed magnet 401 and the magnet 403.

Figure 4B:
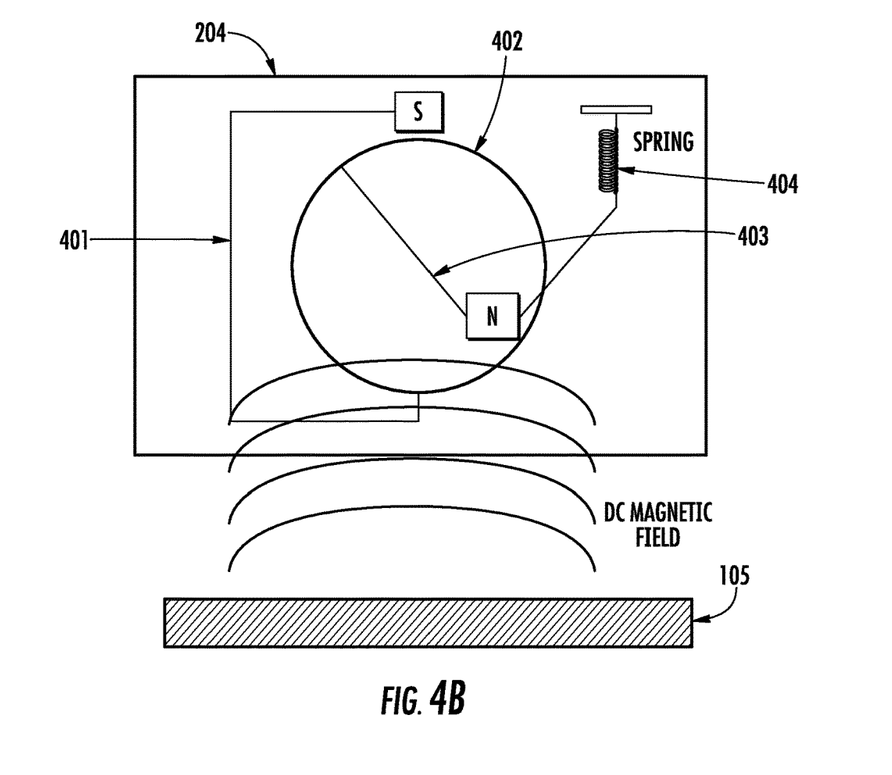
FIG. 4B shows a current detector within an embedded platform to detect direct current (DC) according to one embodiment described herein.

FIG. 4B shows how the current detector 204 can detect DC according to one embodiment. Specifically, FIG. 4B shows that when DC current flows in the electrical cable 100, the rotatable wheel 402 rotates away from its first resting position. As shown in FIG. 4B, when DC current flows through the conductor part 105 of the electrical cable 100, the DC current generates a DC magnetic field. The generated DC magnetic field causes the rotatable wheel 402 to rotate away from its first resting position However, since the DC magnetic field is not a varying or alternating magnetic field as the AC magnetic field described in FIG. 3B, the rotatable wheel 402 will not continuously rotate. As shown in FIG. 4B, after the rotatable wheel 402 starts to rotate, the recoil mechanism 404 resists the rotation by applying a force in the opposite direction of the rotation. For example, due to the DC magnetic field generated by the DC current that flows in the electrical cable 100, the rotatable wheel 402 starts to rotate away from its first resting position. However, the rotatable wheel 402 can only rotate away from its first resting position to a maximum point based on the allowable tension of the recoil mechanism 404. Put differently, the rotational force caused by the DC current and the opposite force applied by the recoil mechanism 404 will eventually reach equilibrium where the wheel 402 no longer rotates and becomes stationary at a second resting point. Although not shown, the current detector 204 can include a sensor to detect when the wheel 402 reaches the second resting point—e.g., a predefined rotational distance away from the first resting position. Thus, if the rotatable wheel 402 starts to rotate away from its first resting position and reaches its second resting position, the current detector 204 can inform the communication circuit 203 that DC current is flowing in the electrical cable 100

FIG. 4A and FIG. 4B are only exemplary embodiments. In other embodiments, different number of magnets may be used. In other embodiments, the fixed position of the magnet 401 may be different. For example, the north pole of the magnet 401 may be fixed in the top part of the current detector 202. Accordingly, the magnet 403 may be coupled to the rotatable wheel 402 in a different way to attract the fixed magnet 401, as understood by an ordinary person in the art.

In one embodiment, the current detector 204 may combine the features as shown in FIG. 3A, FIG. 3B, FIG. 4A and FIG. 4B to detect both AC and DC current that flows in the electrical cable 100. For example, when the electrical cable 100 passes DC electrical power such as Power over Ethernet (POE) along with data (e.g., AC signals), there may be both AC and DC current that flows in the electrical cable 100. In this situation, the current detector 204 may include two rotational wheels to detect both AC and DC current that flows in the electrical cable 100, as understood by an ordinary person in the art. In another embodiment, the current detector 204 may be a voltage detector, e.g. an non-contact AC voltage detector, to detect whether there is a voltage caused by the varying AC magnetic field generated by the AC current that flows in the electrical cable.

If no current has been detected for a long period of time, the electrical cable 100 may have been decommissioned from service, but not from the installation. The NEC has requirements for physical removal of abandoned cables since these cables are only a fuel load for a fire. In one embodiment, if no current has been detected for a long period of time, the communication circuit 203 can transmit or broadcast such information to a remote device. The remote device can determine that the electrical cable 100 should be identified as abandoned and should be physically removed from the installation.

In another embodiment, the communication circuit 203 can transmit or broadcast the measured amperage value of the detected current to a remote device. Because the remote device also receives the product data stored in the non-volatile memory element 202 through the communication circuit 203, the remote device can compare the measured amperage value with the rated amperage value included in the product data. If the measured amperage value exceeds the rated amperage value included in the product data, the electrical cable 100 can be identified as violating the NEC or other applicable product safety requirements.

When multiple embedded platforms are embedded in the electrical cable 100, each embedded platform can include a sensor to determine its own location and each embedded platform can transmit its own location to other embedded platforms in the cable through its communication circuit 203. In this way, each embedded platform can determine the proximity between itself and other embedded platforms. In one embodiment, the communication circuit 203 of one embedded platform can transmit or broadcast information of the proximity between itself and other embedded platforms in the electrical cable 100 to the remote center. This information of the proximity of multiple embedded platforms in the electrical cable 100 can be used to determine geometry of the electrical cable 100 if the electrical cable 100 is coiled. This information of the proximity of multiple embedded platforms in the electrical cable 100 can also be used to calculate bend radius of the electrical cable 100.

In another embodiment, the communication circuit 203 can transmit or broadcast not only the stored and measured data related to the electrical cable 100, but also a mapping of the electrical cable 100 when the electrical cable 100 is not visible (e.g., under a raised-floor, above a drop ceiling).

Figure 5:
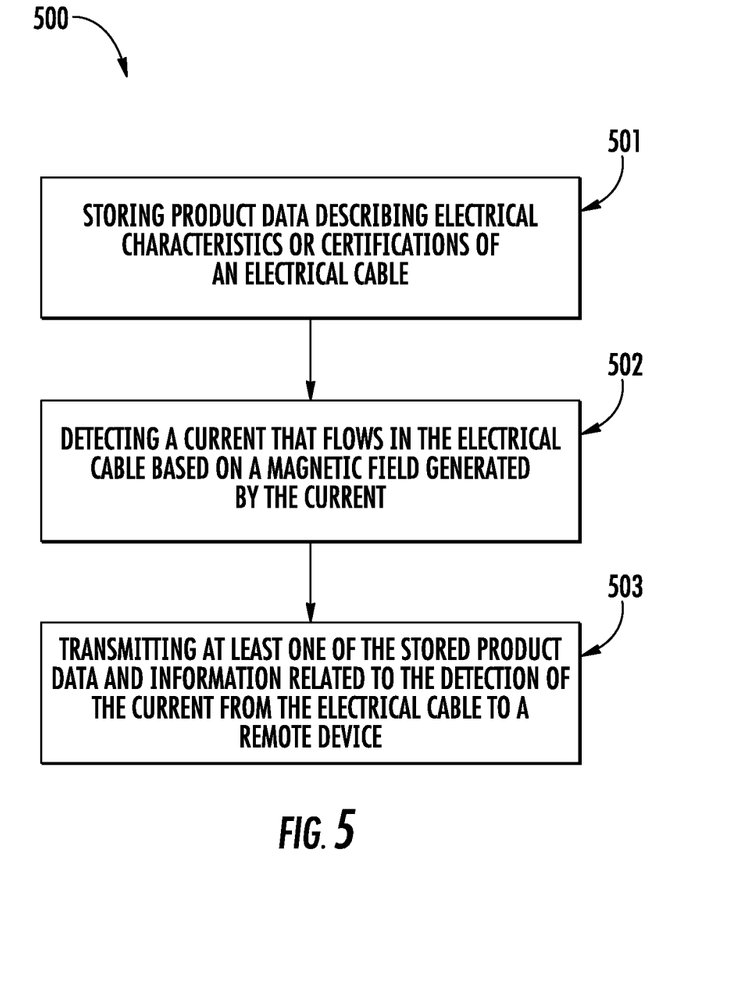
FIG. 5 is a flowchart that illustrates a method of using an embedded platform in an electrical cable according to one embodiment described herein.

FIG. 5 is a flowchart that illustrates a method 500 of using an embedded platform in an electrical cable according to one embodiment described herein. Method 500 can be performed by an embedded platform. At block 501, the embedded platform stores product data describing at least one of electrical characteristics and certifications of an electrical cable in a non-volatile memory element. For examples, the embedded platform may store a certificate of authenticity, jacket information, construction parameters, hyperlinks and measurement data as described above. At block 502, the embedded platform detects a current that flows in the electrical cable based on a magnetic field generated by the current in a current detector. For examples, the embedded platform can use the current detector as described above to detect AC or DC current that flows in the electrical cable. At block 503, the embedded platform transmits at least one of the stored product data and information related to the detection of the current from the electrical cable to a remote device through a communication circuit. The AHJs can access and utilize the product data through the remote device to identify whether the electrical cable is a counterfeit or uncertified electrical cable. For examples, the AHJs may use the certificate of authenticity to identify whether the electrical cable is manufactured by an authorized manufacturer, or use the construction parameters to detect unauthorized modifications or alterations to the electrical cable, as described above.

The present invention provides a positive identification mechanism which provides all the relevant design characteristics that an AHJ can use to identify cable properties and determine whether an electrical cable is counterfeit or uncertified. The embedded chip acts as a stand-alone device which contains data that can be derived from manufacturer specifications, manufacturer reporting, manufacturing line testing, static live operation and external links. The present invention also provides the ability to compare the initial construction, stored in the embedded platform, to an alternate construction which is important with regard to compliance and warranty.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing is directed to embodiments of the present invention, other and further embodiments of the invention may be devised without departing from the basic scope thereof, and the scope thereof is determined by the claims that follow.

What is claimed is:

1. An electrical cable, comprising:
   two end connectors;
   a flexible body coupled between the two end connectors; and
   an embedded platform, wherein the embedded platform comprises:
      a non-volatile memory element configured to store product data describing at least one of electrical characteristics and certifications of the electrical cable,
      a current detector configured to detect a current that flows in the electrical cable based on a magnetic field generated by the current, wherein the current detector comprises a plurality of magnets and a rotatable wheel, and wherein the current that flows in the electrical cable causes rotation of the rotatable wheel, and
      a communication circuit configured to transmit at least one of the stored product data and information related to the detection of the current to a remote device.

2. The electrical cable of claim 1, wherein the product data comprises at least one of:
   a certificate of authenticity provided by a manufacturer of the electrical cable;
   jacket information of the electrical cable;
   construction parameters of the electrical cable;
   hyperlinks to nationally recognized test laboratory (NRTL) approval and reports; and
   initial measurements of torque and impedance of the electrical cable.

3. The electrical cable of claim 1, wherein the current detector is further configured to measure an amperage value of the current that flows in the electrical cable.

4. The electrical cable of claim 1, wherein the communication circuit is further configured to transmit information indicating a proximity of multiple embedded platforms in the electrical cable to the remote device.

5. The electrical cable of claim 1, wherein the current detector is further configured to measure a rotation speed of the rotatable wheel corresponding to a pre-determined amperage value, thereby measuring an amperage value of the current that flows in the electrical cable.

6. The electrical cable of claim 1, wherein the current detector further comprises a recoil mechanism configured to limit the rotation of the rotatable wheel by a tension of the recoil mechanism.

7. The electrical cable of claim 1, wherein the embedded platform comprises:
an integrated circuit including the non-volatile memory element and the communication circuit, wherein the integrated circuit is communicatively coupled to the current detector, wherein the integrated circuit and the current detector are mounted on a printed circuit board (PCB), and wherein the communication circuit is configured to transmit at least one of the stored product data and information related to the detection of the current to the remote device through an antenna disposed on the PCB.

8. A platform configured to be embedded in an electrical cable, comprising:
a non-volatile memory element configured to store product data describing at least one of electrical characteristics and certifications of the electrical cable, wherein the electrical cable comprises a flexible body disposed between two end connectors;
a current detector configured to detect a current that flows in the electrical cable based on a magnetic field generated by the current, wherein the current detector comprises a plurality of magnets and a rotatable wheel, and wherein the current that flows in the electrical cable causes rotation of the rotatable wheel;
a communication circuit configured to transmit at least one of the stored product data and information related to the detection of the current to a remote device.

9. The platform of claim 8, wherein the product data comprises at least one of:
a certificate of authenticity only provided by a manufacturer of the electrical cable;
jacket information of the electrical cable;
construction parameters of the electrical cable;
hyperlinks to nationally recognized test laboratory (NRTL) approval and reports; and
initial measurements of torque and impedance of the electrical cable.

10. The platform of claim 8, wherein the current detector is further configured to measure an amperage value of the current that flows in the electrical cable.

11. The platform of claim 8, wherein the communication circuit is further configured to transmit information indicating a proximity of multiple embedded platforms in the electrical cable to the remote device.

12. The platform of claim 8, wherein the current detector is further configured to measure a rotation speed of the rotatable wheel corresponding to a pre-determined amperage value, thereby measuring an amperage value of the current that flows in the electrical cable.

13. The platform of claim 8, wherein the current detector further comprises a recoil mechanism configured to limit the rotation of the rotatable wheel by a tension of the recoil mechanism.

14. The platform of claim 8, further comprising:
an integrated circuit including the non-volatile memory element and the communication circuit, wherein the integrated circuit is communicatively coupled to the current detector, wherein the integrated circuit and the current detector are mounted on a printed circuit board (PCB), and wherein the communication circuit is configured to transmit at least one of the stored product data and information related to the detection of the current to the remote device through an antenna disposed on the PCB.

15. A method, comprising:
storing product data describing at least one of electrical characteristics and certifications of an electrical cable, wherein the electrical cable comprises a flexible body disposed between two end connectors;
detecting a current that flows in the electrical cable based on a magnetic field generated by the current, wherein the current that flows in the electrical cable causes rotation of a rotatable wheel embedded in the electrical cable; and
transmitting at least one of the stored product data and information related to the detection of the current from the electrical cable to a remote device.

16. The method of claim 15, wherein the product data comprises at least one of:
a certificate of authenticity only provided by a manufacturer of the electrical cable;
jacket information of the electrical cable;
construction parameters of the electrical cable;
hyperlinks to nationally recognized test laboratory (NRTL) approval and reports; and
initial measurements of torque and impedance of the electrical cable.

17. The method of claim 15, further comprising measuring an amperage value of the current that flows in the electrical cable.

18. The method of claim 15, further comprising transmitting information indicating a proximity of multiple embedded platforms in the electrical cable to the remote device, wherein each of the multiple embedded platforms comprise the rotational wheel.

19. The method of claim 15, further comprising measuring a rotation speed of the rotatable wheel corresponding to a pre-determined amperage value, thereby measuring an amperage value of the current that flows in the electrical cable.

20. The method of claim 15, further comprising limiting the rotation of the rotatable wheel by a tension of a recoil mechanism embedded in the electrical cable.

* * * * *